(12) United States Patent
Chapuis et al.

(10) Patent No.: US 8,900,467 B1
(45) Date of Patent: Dec. 2, 2014

(54) METHOD FOR MAKING A CHEMICAL CONTRAST PATTERN USING BLOCK COPOLYMERS AND SEQUENTIAL INFILTRATION SYNTHESIS

(71) Applicant: HGST Netherlands B.V., Amsterdam (NL)

(72) Inventors: Yves-Andre Chapuis, San Francisco, CA (US); Ricardo Ruiz, Santa Clara, CA (US); Lei Wan, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 20 days.

(21) Appl. No.: 13/902,795

(22) Filed: May 25, 2013

(51) Int. Cl.
*C03C 15/00* (2006.01)
*C08J 7/02* (2006.01)

(52) U.S. Cl.
CPC .......................................... *C08J 7/02* (2013.01)
USPC ................. 216/41; 216/49; 216/58; 438/763; 427/255.7; 427/402; 427/404; 427/558; 427/595

(58) Field of Classification Search
USPC .............. 216/41, 49, 58; 438/763; 427/255.7, 427/402, 404, 558, 595
See application file for complete search history.

(56) References Cited

U.S. PATENT DOCUMENTS

| | | | |
|---|---|---|---|
| 7,976,715 B2 | 7/2011 | Dobisz et al. | |
| 8,059,350 B2 | 11/2011 | Albrecht et al. | |
| 8,119,017 B2 | 2/2012 | Albrecht et al. | |
| 2012/0046421 A1 | 2/2012 | Darling et al. | |
| 2012/0241411 A1* | 9/2012 | Darling et al. | 216/67 |

OTHER PUBLICATIONS

Kamcev et al. ("Chemically Enhancing Block Copolymers for Block-Selective Synthesis of Self-Assembled Metal Oxide Nanostructures", ACS Nano, vol. 7, No. 1, pp. 339-346, pub online Dec. 19, 2012).*
Gay et al. ("CMOS compatible strategy based on selective atomic layer deposition of a hard mask for transferring block copolymer lithography patterns", IOP Publishing pp. 1-7, Sep. 29, 2010).*
Peng et al., "A Route to Nanoscopic Materials via Sequential Infiltration Synthesis on Block Copolymer Templates", ACS Nano, Vol. 5, No. 6, 4600-4606, 2011.
George, "Atomic Layer Deposition: An Overview", Chemical Review, 2010, vol. 110, No. 1, 111-131.
Ruiz, et al., "Image Quality and Pattern Transfer in Directed Self Assembly with Block-Selective Atomic Layer Deposition", Journal of Vacuum Science & Technology B: Microelectronics and Nanometer Structures, 2012, 30, (6).
Tseng et al., "Enhanced Block Copolymer Lithography Using Sequential Infiltration Synthesis", J. Phys. Chem. C, 2011, 115 (36), pp. 17725-17729.

* cited by examiner

*Primary Examiner* — Nadine Norton
*Assistant Examiner* — Christopher Remavege
(74) *Attorney, Agent, or Firm* — Thomas R. Berthold

(57) ABSTRACT

A method for making a chemical contrast pattern uses directed self-assembly of block copolymers (BCPs) and sequential infiltration synthesis (SIS) of an inorganic material. For an example with poly(styrene-block-methyl methacrylate) (PS-b-PMMA) as the BCP and alumina as the inorganic material, the PS and PMMA self-assemble on a suitable substrate. The PMMA is removed and the PS is oxidized. A surface modification polymer (SMP) is deposited on the oxidized PS and the exposed substrate and the SMP not bound to the substrate is removed. The structure is placed in an atomic layer deposition chamber. Alumina precursors reactive with the oxidized PS are introduced and infuse by SIS into the oxidized PS, thereby forming on the substrate a chemical contrast pattern of SMP and alumina. The resulting chemical contrast pattern can be used for lithographic masks, for example to etch the underlying substrate to make an imprint template.

23 Claims, 9 Drawing Sheets

METHOD FOR MAKING A CHEMICAL CONTRAST PATTERN USING BLOCK COPOLYMERS AND SEQUENTIAL INFILTRATION SYNTHESIS

BACKGROUND OF THE INVENTION

1. Field of the Invention

This invention relates generally to the use of block copolymers (BCPs) to make a chemical contrast pattern, and more particularly to the use of the chemical contrast pattern as an etch mask for pattern transfer into a substrate.

2. Description of the Related Art

Directed self-assembly (DSA) of block copolymers (BCPs) has been proposed for making imprint templates. Imprint templates have application in making patterned-media magnetic recording disks and in semiconductor manufacturing, for example, for patterning parallel generally straight lines in MPU, DRAM and NAND flash devices. DSA of BCPs by use of a patterned sublayer for the BCP film is well-known. After the BCP components self-assemble on the patterned sublayer, one of the components is selectively removed, leaving the other component with the desired pattern, which can be used as an etch mask to transfer the pattern into an underlying substrate. The etched substrate can be used as an imprint template.

More recently a method termed "sequential infiltration synthesis" (SIS) uses a BCP and atomic layer deposition (ALD) to selectively grow nanometer scale patterns of inorganic material inside BCP. In SIS, a BCP film is deposited onto a substrate and annealed to form a self-assembled pattern of the two BCP components. In one example, the BCP is poly(styrene-block-methyl methacrylate) (PS-b-PMMA). A first precursor for the inorganic material is introduced into the ALD and infiltrates the PMMA but does not react with the PS. A second precursor for the inorganic material is then introduced to finish the reaction, forming the inorganic material, for example alumina ($Al_2O_3$), in the locations in the PMMA where the first precursor attached. The PS and PMMA are removed, leaving a pattern that generally replicates the original pattern of PS and PMMA but that is now made of the inorganic material synthesized by the ALD precursors. This pattern of inorganic material can then be used as an etch mask to etch the substrate.

While the conventional SIS method provides a way to use the distinct chemistries of the constituent components of a BCP film to grow materials by ALD on specific locations, the density of active sites where the ALD precursor can bind is extremely low, especially when using the method to achieve dimensions down to a few nanometers. It has been found that after removal of all of the polymer material (the PS and PMMA in the above example), the amount of inorganic material (alumina in the above example) is not sufficient to make a robust etch mask. This is because the remaining features may be discontinuous or may have shifted as the PS and PMMA is removed, thus degrading the image quality of the original pattern.

What is needed is a method for making a chemical contrast pattern with BCPs that uses SIS but that does not result in a pattern with discontinuous or shifted features.

SUMMARY OF THE INVENTION

Embodiments of the invention relate to methods that use DSA of BCPs and take advantage of SIS to make a chemical contrast pattern. For the example with PS and PMMA as the BCP components, in contrast to the conventional SIS method, embodiments of the invention remove the PMMA prior to the ALD and makes the PS the active material for the ALD. The inorganic material grown by ALD in the active PS replicates the original pattern without major image quality distortions.

In an example of the method that uses PS-b-PMMA as the BCP and alumina as the inorganic material, the PS and PMMA self-assemble on a patterned sublayer formed on a suitable substrate. The PMMA is removed to expose regions of the underlying substrate, leaving the PS on the substrate, after which the PS is oxidized. A surface modification polymer (SMP) having functional end groups is deposited on the oxidized PS and the exposed substrate regions and the SMP not bound to the substrate is removed. The substrate with the bound SMP and oxidized PS is then placed in an atomic layer deposition (ALD) chamber and the alumina precursors are introduced. The precursors are non-reactive with the SMP but reactive with the oxidized PS, so that alumina is formed in the oxidized PS, thereby forming on the substrate a chemical contrast pattern of SMP and alumina. The resulting chemical contrast pattern can be used for lithographic masks, for example to etch the underlying substrate to make an imprint template.

The chemical contrast pattern can also be used as a pattern for DSA of additional BCP that results in a more robust pattern for pattern transfer into a substrate, as compared to the conventional SIS method. For the example where alumina is the inorganic material, the pattern of SMP and PS with alumina directs the self-assembly of a second upper BCP film. If the second BCP is also PS-b-PMMA, then the SMP bound to the substrate is preferentially wet by the PS of the second BCP, whereas the alumina on the first PS is preferentially wet by the second PMMA. In this case, the second upper BCP components replicate the pattern of the original underlying first BCP components, but with a "phase shift", i.e., in those regions where originally there was PS, now there is a PMMA, and vice versa. Upon annealing, the chemical contrast pattern of the underlying SMP and PS with alumina directs the self assembly of the additional upper PMMA and PS components into a periodic pattern that replicates the underlying chemical contrast pattern. The structure is then placed in an ALD and exposed to the alumina precursors. The alumina now becomes infused into the second upper PMMA. As a result there is an upper pattern of PMMA with infused alumina directly above a lower pattern of PS with infused alumina. The PS and PMMA are removed, for example by reactive ion etching (RIE), condensing the infused alumina in the upper PMMA on top of the previously infused alumina in the lower PS. The resulting chemical contrast pattern can be used for lithographic masks, for example to etch the underlying substrate to make an imprint template.

For a fuller understanding of the nature and advantages of the present invention, reference should be made to the following detailed description taken together with the accompanying figures.

DETAILED DESCRIPTION OF THE INVENTION

Figure 1A:
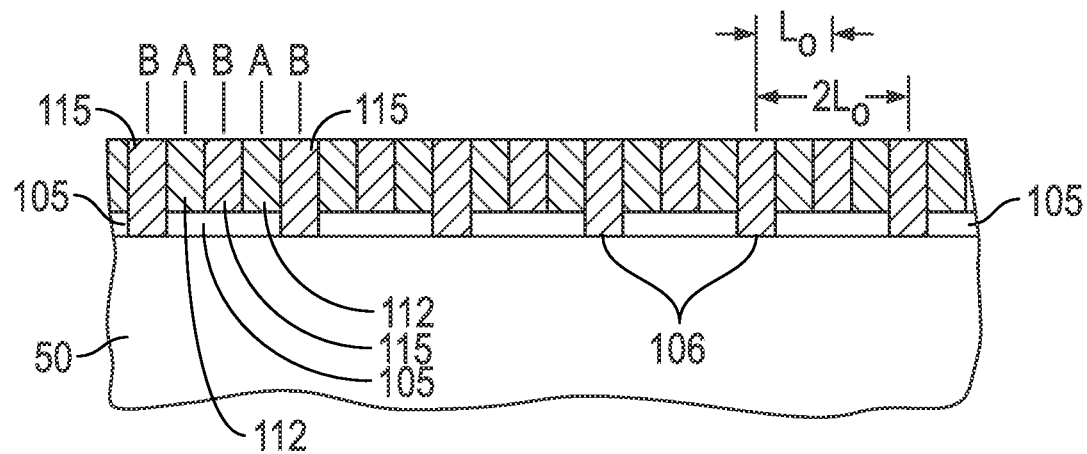
FIGS. 1A-1D are view illustrating the prior art method for making an imprint template using directed self-assembly (DSA) of block copolymers (BCPs).

Self-assembling block copolymers (BCPs) have been proposed for creating periodic nanometer (nm) scale features. Self-assembling BCPs typically contain two or more different polymeric block components, for example components A and B, that are immiscible with one another. Under suitable conditions, the two or more immiscible polymeric block components separate into two or more different phases or microdomains on a nanometer scale and thereby form ordered patterns of isolated nano-sized structural units. There are many types of BCPs that can be used for forming the self-assembled periodic patterns. If one of the components A or B is selectively removable without having to remove the other, then an orderly arranged structural units of the un-removed component can be formed.

Specific examples of suitable BCPs that can be used for forming the self-assembled periodic patterns include, but are not limited to: poly(styrene-block-methyl methacrylate) (PS-b-PMMA), poly(ethylene oxide-block-isoprene) (PEO-b-PI), poly(ethylene oxide-block-butadiene) (PEO-b-PBD), poly(ethylene oxide-block-styrene) (PEO-b-PS), poly(ethylene oxide-block-methylmethacrylate) (PEO-b-PMMA), poly(ethyleneoxide-block-ethylethylene) (PEO-b-PEE), poly(styrene-block-vinylpyridine) (PS-b-PVP), poly(styrene-block-isoprene) (PS-b-PI), poly(styrene-block-butadiene) (PS-b-PBD), poly(styrene-block-ferrocenyldimethylsilane) (PS-b-PFS), poly(butadiene-block-vinylpyridine) (PBD-b-PVP), poly(isoprene-block-methyl methacrylate) (PI-b-PMMA), poly(styrene-block-lactic acid) (PS-b-PLA) and poly(styrene-block-dymethylsiloxane) (PS-b-PDMS).

The specific self-assembled periodic patterns formed by the BCP are determined by the molecular volume ratio between the first and second polymeric block components A and B. When the ratio of the molecular volume of the second polymeric block component B over the molecular volume of the first polymeric block component A is less than about 80:20 but greater than about 60:40, the BCP will form an ordered array of cylinders composed of the first polymeric block component A in a matrix composed of the second polymeric block component B. When the ratio of the molecular volume of the first polymeric block component A over the molecular volume of the second polymeric block component B is less than about 60:40 but is greater than about 40:60, the BCP will form alternating lamellae composed of the first and second polymeric block components A and B. The un-removed component is used as an etch mask to etch the underlying template substrate. When the ratio of B over A is greater than about 80:20 the BCP will form an ordered array of spheres in a matrix of the second component. For lamellar or cylinder forming BCPs, the orientation of the lamellae or the cylinders with respect to the substrate depends on the interfacial energies (wetting properties) of the block copolymer components at both the substrate interface and at the top interface. When one of the block components preferentially wets the substrate (or the top free interface) the block copolymers form layers parallel to the substrate. When the wetting properties at the interface are neutral to either block, then both block components can be in contact with the interface, facilitating the formation of block copolymer domains with perpendicular orientation. In practice, the wetting properties of the substrate are engineered by coating the substrate with "surface modification layers" that tune the wetting properties at the interface. Surface modification layers are usually made of polymer brushes or mats typically (but not necessarily) composed of a mixture of the constituent block materials of the BCP to be used.

The periodicity or natural pitch ($L_0$) of the repeating structural units in the periodic pattern is determined by intrinsic polymeric properties such as the degree of polymerization N and the Flory-Huggins interaction parameter $\chi$. $L_0$ scales with the degree of polymerization N, which in turn correlates with the molecular weight M. Therefore, by adjusting the total molecular weight of the BCP, the natural pitch ($L_0$) of the repeating structural units can be selected.

To form the self-assembled periodic patterns, the BCP is first dissolved in a suitable solvent system to form a BCP solution, which is then applied onto a surface to form a thin BCP layer, followed by annealing of the thin BCP layer, which causes phase separation between the different polymeric block components contained in the BCP. The solvent system used for dissolving the BCP and forming the BCP solution may comprise any suitable non-polar solvent, including, but not limited to: toluene, propylene glycol monomethyl ether acetate (PGMEA), propylene glycol monomethyl ether (PGME), and acetone. The BCP solution can be applied to the substrate surface by any suitable techniques, including, but not limited to: spin casting, coating, spraying, ink coating, dip coating, etc. Preferably, the BCP solution is spin cast onto the substrate surface to form a thin BCP layer. After application of the thin BCP layer onto the substrate surface, the entire substrate is annealed to effectuate microphase segregation of the different block components contained by the BCP, thereby forming the periodic patterns with repeating structural units.

The BCP films in the above-described techniques self-assemble without any direction or guidance. This undirected self-assembly results in patterns with defects so it is not practical for applications that require long-range ordering, such as for making imprint templates. However, directed self-assembly (DSA) of block copolymers (BCPs) has been proposed for making imprint templates. DSA of BCPs by use of a patterned sublayer for the BCP film is well-known, as described for example in U.S. Pat. No. 7,976,715; U.S. Pat. No. 8,059,350; and U.S. Pat. No. 8,119,017. Pending application Ser. No. 13/627,492, filed Sep. 26, 2012 and assigned to the same assignee as this application, describes the use DSA of BCPs to make two submaster imprint templates, one with a pattern of generally radial lines, and the other with generally concentric rings, to make a master imprint template, which is then used to imprint patterned-media magnetic recording disks. Imprint templates made with DSA of BCPs have also been proposed for use in semiconductor manufacturing, for example, for patterning parallel generally straight lines in MPU, DRAM and NAND flash devices.

Figure 1B:
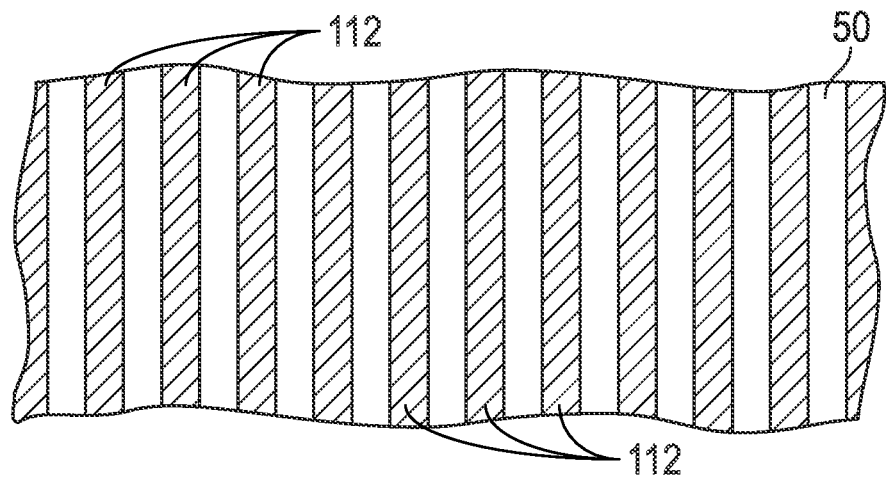
Figure 1C:
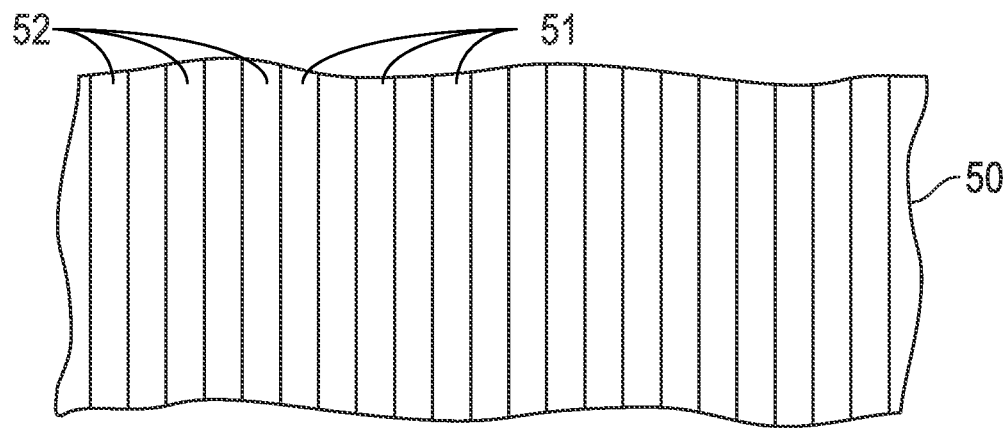
Figure 1D:
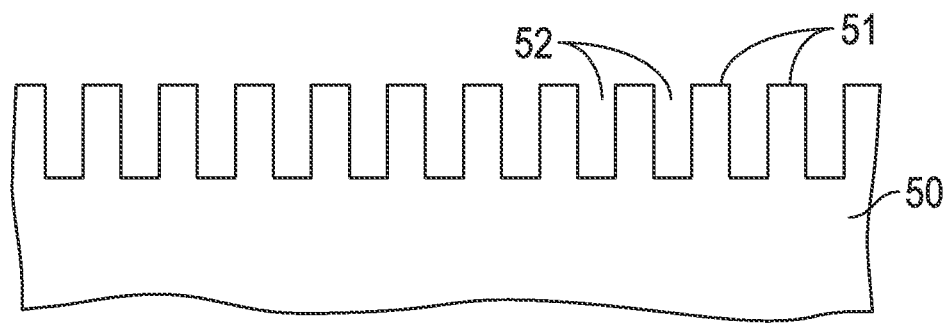

The prior art method for making an imprint template using DSA of BCPs will be described in general terms with FIGS. 1A-1D for an example where the template 50 will become an imprint template with protrusions 51 in a pattern of parallel bars. FIG. 1A is a side sectional view showing a patterned sublayer 105 on the surface of template 50. Alternating A component (polystyrene—PS) parallel lines 112 and B component (PMMA) parallel lines 115 are formed on a sublayer 105 and regions 106. The regions 106 can be exposed portions of the template 50 not covered by sublayer 105 or regions covered by a different sublayer. The sublayer 105 has been patterned to direct the self-assembly of the BCP A and B components with a natural pitch of $L_0$. In FIG. 1B, the portions of parallel lines 115, the B component (PMMA), are then selectively removed by a wet etch or a dry etch process. This leaves generally parallel lines 112 of the A component (PS) on the template 50. Then, a dry etch process is used to etch the template 50 to form recesses 52 using the parallel lines 112 as the etch mask. The material of parallel lines 112 and the remaining underlying sublayer 105 is then removed, leaving recesses 52 in template 50. This leaves the structure as shown in FIG. 1C, with a pattern of protrusions formed as parallel bars 51 and recesses formed as parallel bars 52. FIG. 1D is a side sectional view of the resulting imprint template.

Figure 2A:
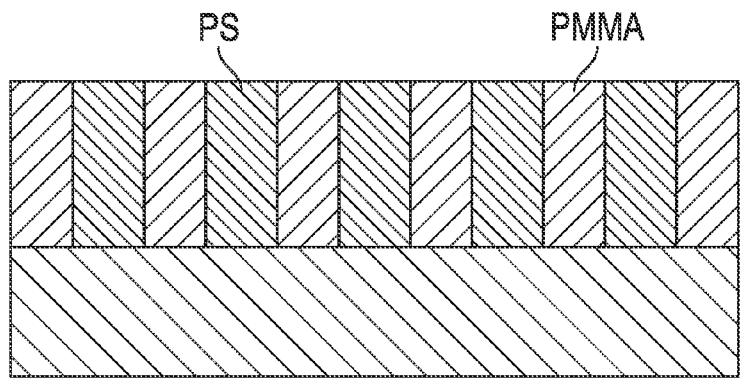
FIGS. 2A-2F are side sectional views illustrating the prior art sequential infiltration synthesis (SIS) method using atomic layer deposition (ALD) and a BCP film.
Figure 2B:
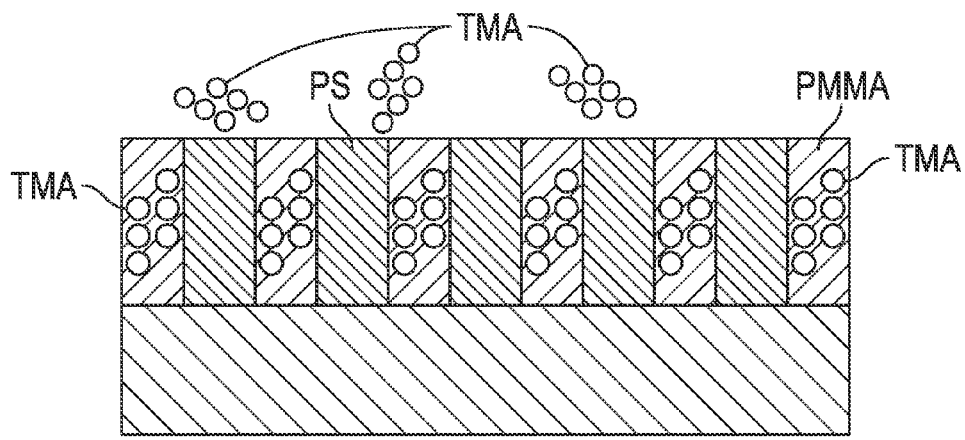
Figure 2C:
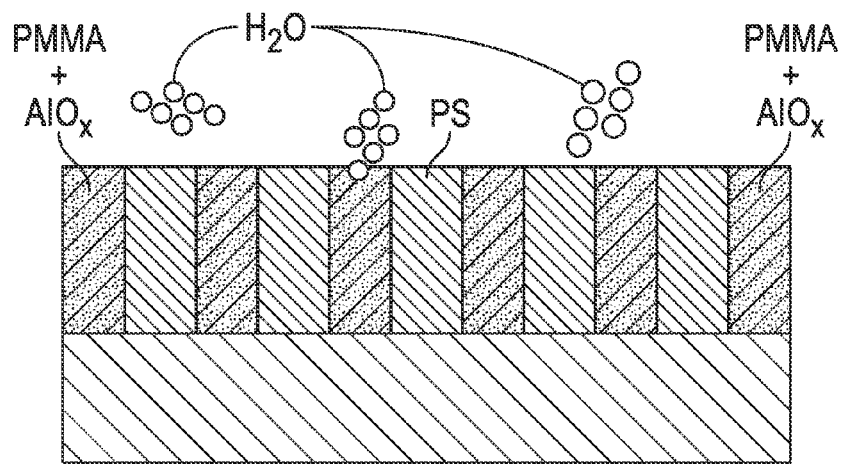
Figure 2D:
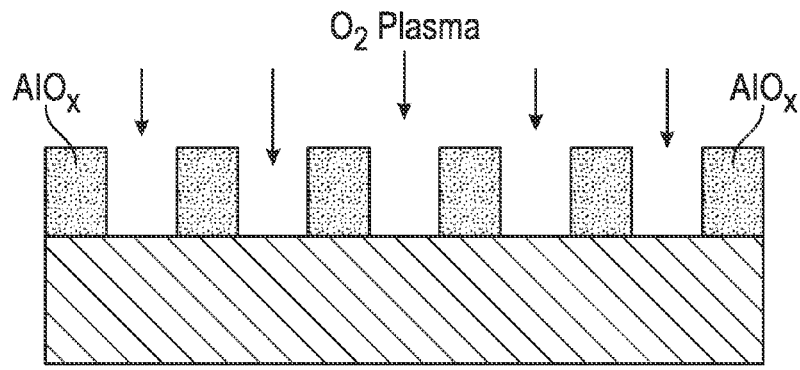
Figure 2E:
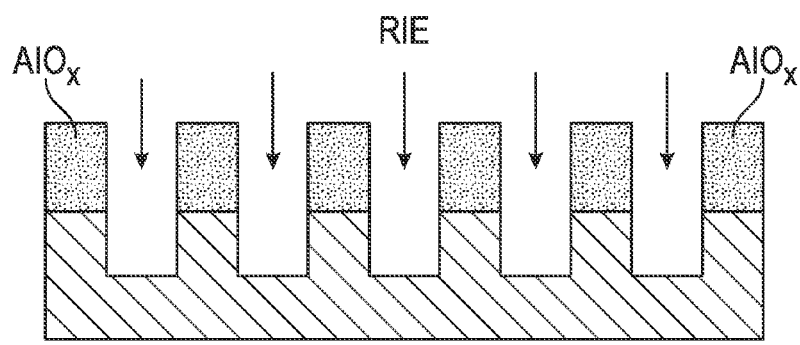
Figure 2F:
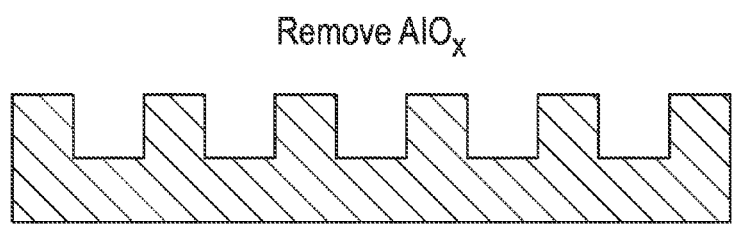

More recently a method termed "sequential infiltration synthesis" (SIS) uses BCP films and atomic layer deposition (ALD) to selectively grow nanometer scale patterns of inorganic material inside BCP films. (See Peng et al., "A Route to Nanoscopic Materials via Sequential Infiltration Synthesis on Block Copolymer Templates", *ACS Nano*, VOL. 5, NO. 6, 4600-4606, 2011). This process is depicted in FIGS. 2A-2F. In SIS, a BCP film is deposited onto a substrate and annealed to form a self-assembled pattern, for example PS and PMMA (FIG. 1A). The sample is then placed in an ALD chamber, such as those available from Cambridge Nanotech Inc. of Cambridge, Mass. ALD is known as a process for forming very thin films on a substrate. ALD involves deposition of gas phase precursor molecules. Most ALD processes are based on binary reaction sequences where two surface reactions occur and deposit a binary compound film, such as the use of trimethylaluminum (TMA) and $H_2O$ to form alumina ($Al_2O_3$). An overview of ALD is presented by George, "Atomic Layer Deposition: An Overview", *Chemical Review*, 2010, Vol. 110, No. 1, 111-131. In SIS, the BCP has been chosen so that one component, for example PS, is inert to the ALD precursors while the other component, PMMA, reacts with the precursor. A first precursor, for example TMA, is introduced into the ALD chamber (FIG. 2B). PMMA contains carbonyl groups that react with the TMA, causing the TMA to infiltrate the PMMA. The controlled interaction of TMA with carbonyl groups in the PMMA generates Al—$CH_3$/Al—OH sites inside the PMMA. A second precursor, for example water vapor, is then introduced to finish the reaction, forming alumina in the locations in the PMMA where the TMA attached (FIG. 2C). The processes may be repeated a number of cycles to increase the amount of infiltrated alumina. For lithographic applications, the PS component, which is inert to the ALD precursors, and the PMMA material is then removed by oxygen plasma to leave a pattern that mimics the original pattern of PS and PMMA but that is now made of the alumina synthesized by the ALD precursors (FIG. 2D). This pattern of alumina can then be used as an etch mask to reactively ion etch (RIE) the substrate (FIG. 2E), after which the alumina is removed, leaving the etched substrate (FIG. 2F).

While the conventional SIS method provides a way to use the distinct chemistries of the constituent components of a BCP film to grow materials by ALD on specific locations, the density of active sites where the ALD precursor can bind is extremely low, especially when using the method to achieve dimensions down to a few nanometers. It has been found that after removal of all of the polymer material (the PS and PMMA in the above example), the amount of inorganic material (alumina in the above example) is not sufficient to make a robust etch mask. This is because the remaining features may be discontinuous or may have shifted as the PS and PMMA is removed, thus degrading the image quality of the original pattern. This is described by R. Ruiz, et al., *Journal of Vacuum Science & Technology B: Microelectronics and Nanometer Structures*, 2012, 30, (6).

Embodiments of the invention use DSA of BCPs and take advantage of SIS to make a chemical contrast pattern. For the example with PS and PMMA as the BCP components, in contrast to the conventional SIS method, an embodiment of the invention removes the PMMA prior to the ALD and makes the PS the active material for the ALD. The inorganic material grown by ALD in the active PS replicates the original pattern without major image quality distortions. The resulting chemical contrast pattern can be used for lithographic masks, for example to etch the underlying substrate to make an imprint template, or as a chemical contrast pattern to guide the growth of other materials, such as in DSA.

Figure 3A:
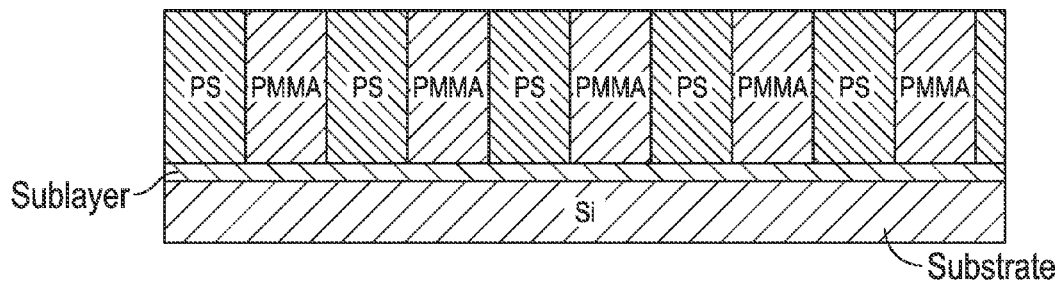
FIGS. 3A-3E are side sectional views illustrating embodiments of the invention to make a chemical contrast pattern using BCPs and SIS.

An embodiment of the invention is illustrated in FIGS. 3A-3E. FIG. 3A is a cross-sectional view of a BCP film that has been directed to self-assemble into PMMA and PS by a patterned sublayer on a suitable substrate, in this example a silicon (Si) substrate that may have a silicon oxide surface. The substrate may be formed of any suitable material, such as, but not limited to, single-crystal Si, amorphous Si, silica, fused quartz, silicon nitride, carbon, tantalum, molybdenum, chromium, alumina and sapphire. The sublayer may be a nearly neutral layer of a material that does not show a strong wetting affinity by one of the polymer blocks over the other. The neutral layer can be, but is not restricted to, a functionalized polymer brush like carboxyl-terminated or hydroxyl-terminated brush, a cross-linkable polymer, a functionalized polymer "A" or "B" or a functionalized random copolymer "A-r-B". The functional group may be, for example, a hydroxyl (OH) group. In the present example, the substrate has a silicon oxide surface film and the neutral layer is a hydroxyl-terminated poly(styrene-r-methyl methacrylate) brush containing ~67% styrene. Alternatively, the sublayer may be a material known as a polymer "mat" layer that shows strong wetting affinity by one of the polymer blocks over the other. The material of mat layer can be, but is not limited to, a cross-linkable polymer "A" or "B" like a crosslinkable polystyrene (XPS mat). The sublayer material may be spin-coated on the substrate to a thickness of about 1-10 nm. The sublayer is annealed for the end-groups to graft to the oxidized substrate surface in the case of an end-functionalized material or for the cross linking units to carry the cross-linking in the case of polymer "mats". After annealing, any ungrafted sublayer material is rinsed away in a suitable solvent (toluene, PGMA, NMP, etc). The purpose of the sublayer is to tune the surface energy adequately to promote the desired domain orientation (for example, perpendicular lamellae of the BCP components).

For DSA, additional steps are required to create a chemical pattern in the sublayer. These steps may include e-beam lithography, photolithography or nanoimprint lithography and potentially a combination of polymer mats and brushes. For example, a resist layer can be patterned by e-beam, followed by deposition of the sublayer material and removal of the resist. Alternatively, the chemical structure of exposed portions of a neutral sublayer can be chemically damaged or altered (by oxygen plasma etching or other process such as RIE, neutral atom (such as Ar) or molecule milling, ion bombardment and photodegradation) so that the exposed portions of the neutral sublayer have a preferred affinity (or repulsion) for one of the BCP components.

The resulting pattern of the sublayer directs the BCP components to self-assemble according to the pattern. The BCP is chosen to form either lamellae, cylinders or spheres with a characteristic center-to-center distance or "natural pitch" $L_O$ in the range of 5-50 nm.

FIG. 3A shows an example of lamellae-forming poly(styrene-block-methyl methacrylate) (PS-b-PMMA) BCP for which the OH-terminated brush neutral layer was chosen as the sublayer to promote perpendicular orientation of the lamellar domains.

Figure 3B:
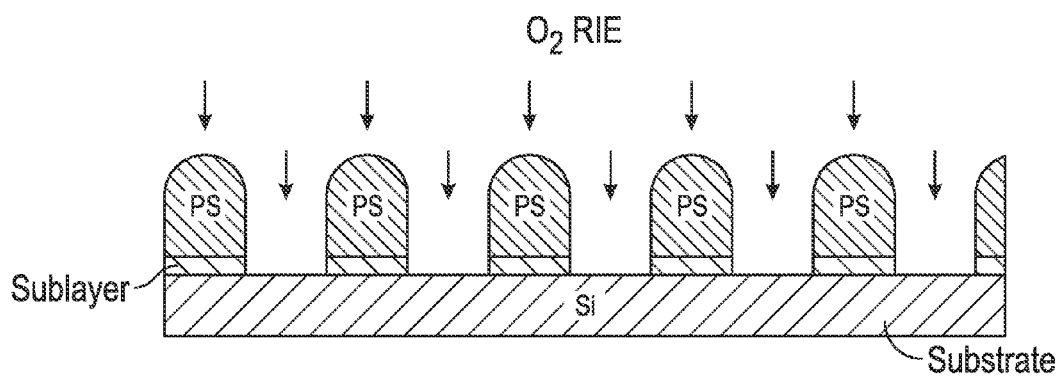

In FIG. 3B one of the two BCP components is selectively removed, for example by reactive ion etching (RIE), wet etching, or ion milling. In the example of FIG. 3B, the PMMA and the underlying sublayer regions have been removed by oxygen plasma RIE. The remaining component, in this example the PS, needs to be chemically active to react with the ALD precursors. The remaining component material may naturally contain active groups, such as carbonyl or hydroxyl groups, or it's chemistry may be altered, for example by an oxygen plasma and/or UV radiation, to render the material active for reaction with the ALD precursors. In the example of FIG. 3B, the PMMA component is removed by RIE with an oxygen plasma. The oxygen plasma also simultaneously oxidizes the remaining PS, creating active groups, including carbonyl groups, that can react with the ALD precursors. An additional UV curing step may be applied to further harden the remaining PS material.

Figure 3C:
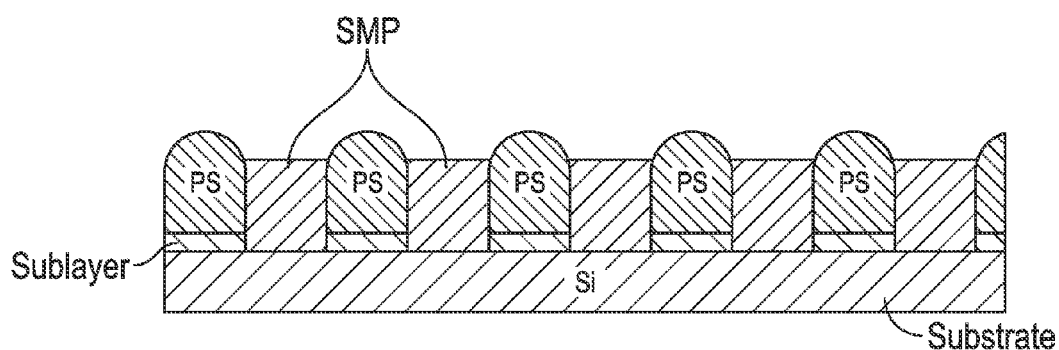

Next, in FIG. 3C, a layer of a surface modification polymer (SMP) with functionalized groups is applied onto the substrate with the PS and annealed. The SMP is chosen from a material that is generally inert to the ALD precursors. The functionalized groups of the SMP are chosen to chemically bind with the exposed portions of the substrate, but not with the remaining BCP component. In the example of FIG. 3C, where the substrate is a Si substrate with a native $SiO_x$ surface, the SMP is a PS-OH brush for which the OH functional groups bind to the $SiO_x$ surface after thermal annealing. After annealing, the excess brush material that is not bound to the substrate can be rinsed away. The resulting pattern consists of features that are chemically prone to react with the ALD precursors (in this example, the PS modified by the oxygen plasma) and features that are chemically inert to the ALD precursors (the SMP bound to the substrate).

Figure 3D:
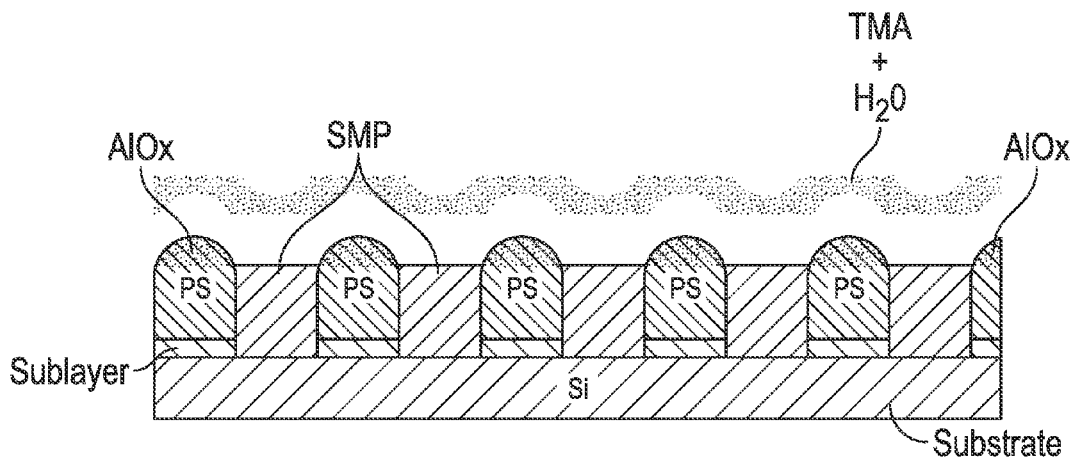
Figure 3E:
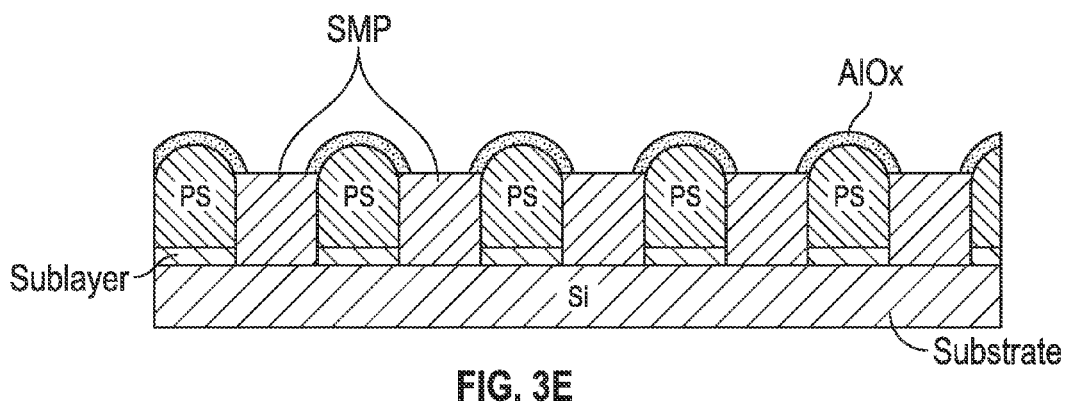

In FIG. 3D the structure of FIG. 3C is placed in an ALD chamber and exposed to chemical precursors that react only with one material in the pattern (in this example the oxidized PS). For example, if the chemical precursors are a sequence of trimethyl aluminum, TMA and water, the TMA will react with the carbonyl groups in the oxidized PS and become infused into the PS material. The second water precursor reacts with the TMA to form an aluminum oxide ($AlO_x$), which is predominately alumina, in the PS. The ALD process can be repeated a number of cycles to form the desired amount of alumina film in the PS. It is possible to first run the ALD tool in "static mode", also called as "sequential infiltration synthesis" (SIS), depicted in FIG. 3D, to infuse the TMA inside the oxidized PS, and then switch to conventional thermal ALD, wherein the substrate is heated, to increase the growth rate and to grow alumina films on top of the targeted PS, as depicted in FIG. 3E. The resulting chemical contrast pattern in FIGS. 3D and 3E mimics the original PS/PMMA pattern (FIG. 3A) with higher fidelity and higher continuity than the conventional SIS method. In conventional SIS, the features of alumina infiltrated in the PMMA (FIG. 1D) can be discontinuous after the removal of the PS/PMMA polymer matrix. In FIG. 3D, the thickness of the PS has been reduced during the oxygen plasma RIE that oxidizes the PS, as shown by the reduced height of the PS from FIG. 3A to FIG. 3B. This places the alumina closer to the substrate than conventional SIS, making it less prone to mechanical deformations when the PMMA is removed. In the conventional SIS method, because the alumina is infiltrated over the entire thickness of the PMMA in a rather low density matrix, the alumina is prone to deformation upon removal of the PMMA and PS. The aspect ratio (thickness to width) of the PMMA with infused alumina in conventional SIS is fairly large, around 2:1, whereas the aspect ratio for the PS with infused alumina may be less than 1.

Figure 4A:
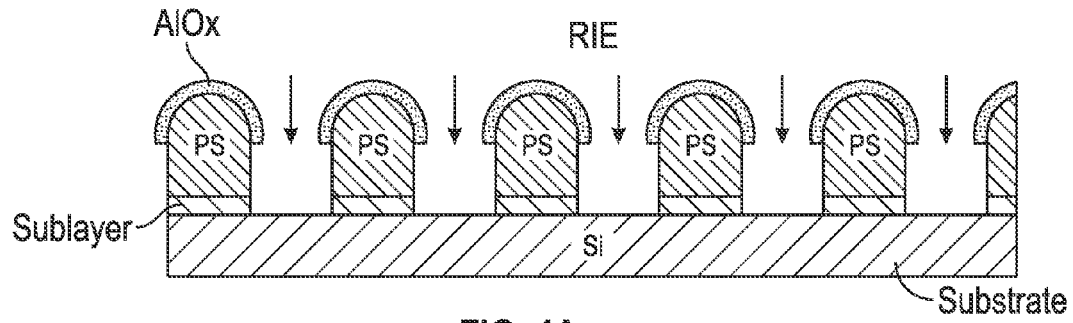
FIGS. 4A-4C are side sectional views illustrating use of the chemical contrast pattern made according to embodiments of the invention as an etch mask for pattern transfer into a substrate.
Figure 4B:
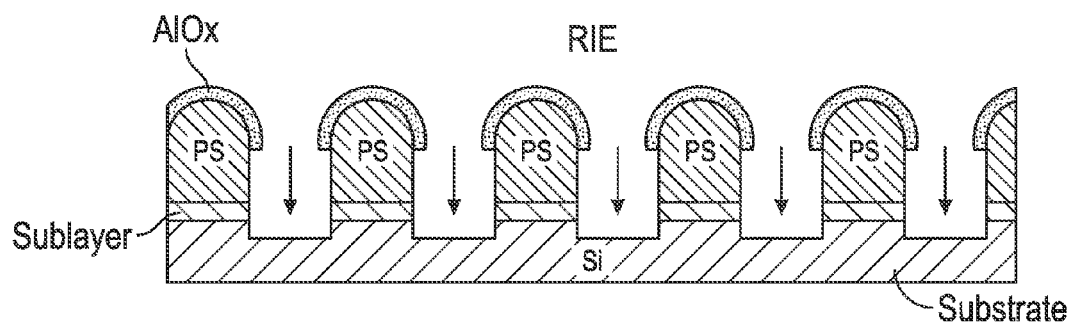
Figure 4C:
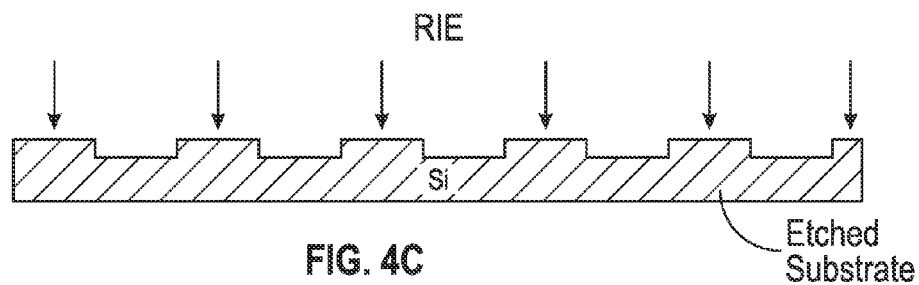

The chemical contrast pattern depicted in FIG. 3D or 3E can be used as an etch mask for pattern transfer. FIGS. 4A-4C illustrate the additional steps. In FIG. 4A, the SMP bound to the substrate (shown in FIGS. 3D and 3E), i.e., the PS-OH brush layer material in the regions between the PS with alumina that did not react with the ALD precursors, is selectively removed by RIE in an oxygen plasma. In FIG. 4B, a second RIE can be used to etch into the substrate, using the PS with alumina as an etch mask. In the example with a Si substrate and alumina on the PS, a fluorine etch can be used to etch features into the Si substrate. In FIG. 4C, the remaining alumina and underlying PS material can be removed by RIE or a wet etch. Alternatively, the substrate could have suitable transfer layers, like a hard mask, between the substrate and the PS with alumina, to aid in transferring the chemical contrast pattern into the substrate. The resulting substrate with the etched pattern can be used as an imprint template.

Figure 5A:
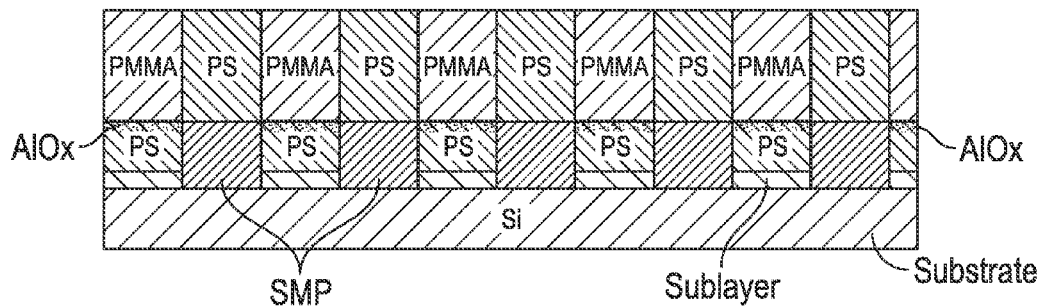
FIGS. 5A-5E are side sectional views illustrating use of the chemical contrast pattern made according to embodiments of the invention as a pattern for DSA of an additional BCP to create a more robust pattern as an etch mask for pattern transfer into a substrate.
Figure 5B:
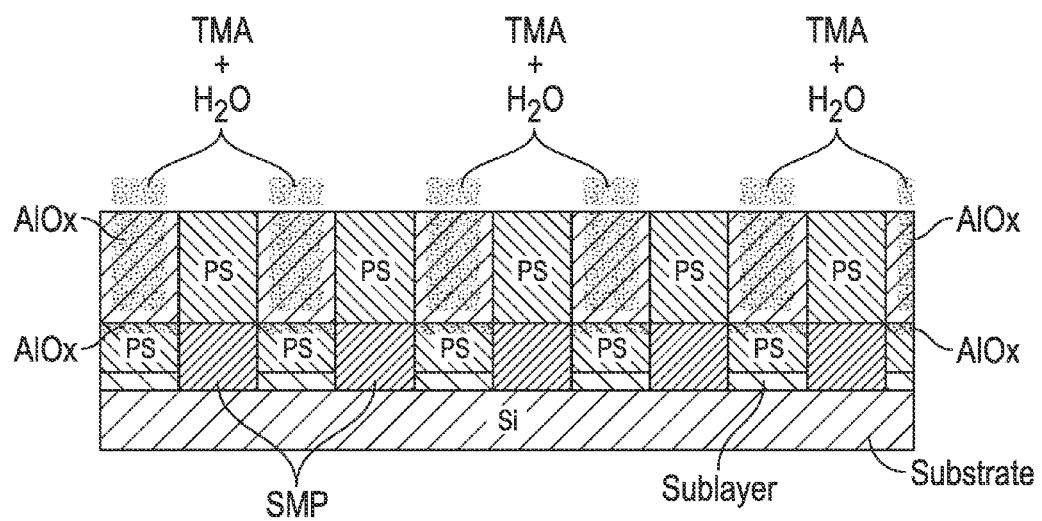
Figure 5C:
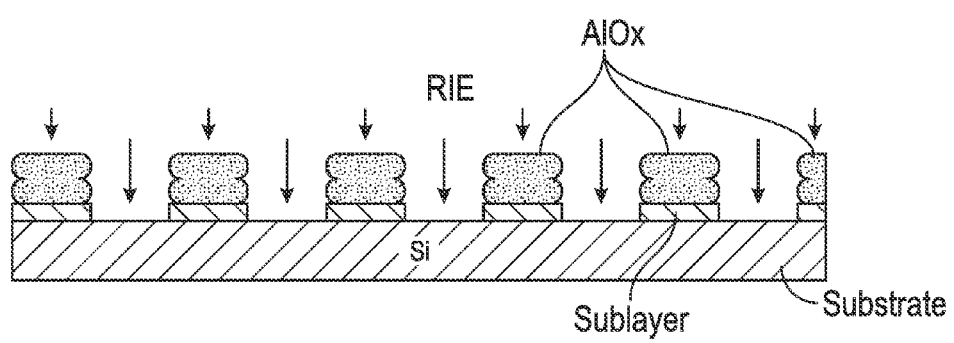
Figure 5D:
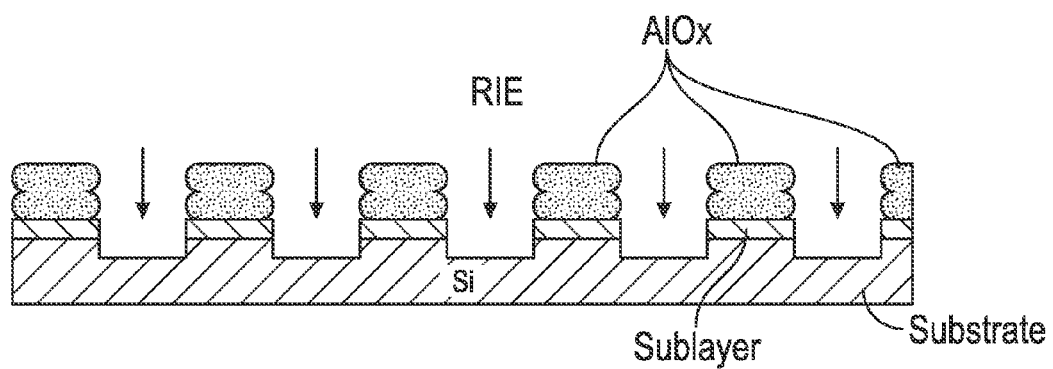
Figure 5E:
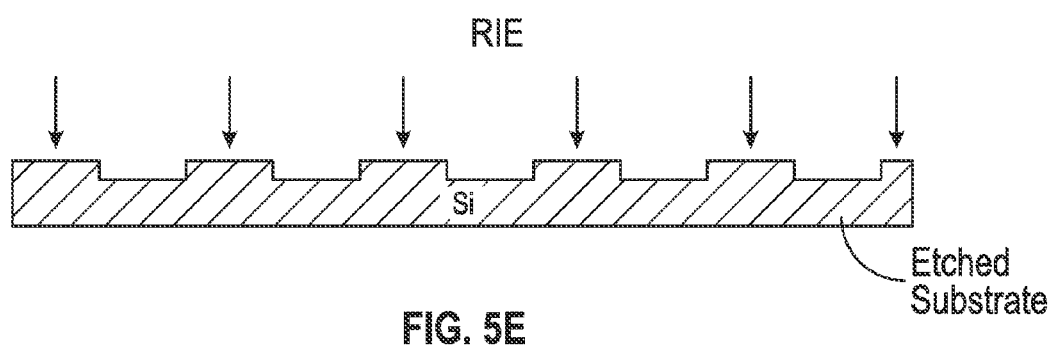

The chemical contrast pattern can be also used as a pattern for DSA of the same BCP that results in a more robust pattern for pattern transfer into a substrate, as compared to the conventional SIS method. The process is shown in FIGS. 5A-5E. This process starts from the chemical contrast pattern depicted either in FIG. 3D or 3E. The pattern of SMP and PS with alumina direct the self-assembly of a second BCP film. In FIG. 5A a thin film of a second BCP is spin coated on top of the chemical contrast pattern of the SMP and PS with alumina. The second BCP can have the same or different components as the first BCP, but should have the same natural pitch ($L_O$) as the first BCP (like the example of FIG. 5A) or a natural pitch that is an integer fraction, for example ½, the natural pitch of the first BCP. In the example shown in FIG. 5A, the PS-OH brush (the SMP) bound to the substrate is preferentially wet by the PS of the second additional PS-b-PMMA BCP, whereas the alumina on the PS is preferentially wet by the additional PMMA. This is because PMMA, being a more polar molecule, preferentially wets the oxide interface, while PS preferentially wets the PS in the SMP. In this case, the second BCP components replicate the pattern of the original underlying BCP components, but with a "phase shift". In those regions where originally there was PS, now there is a PMMA, and vice versa. Upon annealing, the chemical contrast pattern of the underlying SMP and PS with alumina directs the self assembly of the additional PMMA and PS components into a periodic pattern that replicates the underlying chemical contrast pattern. In FIG. 5B, the structure is now exposed to ALD precursors for SIS. The TMA precursor selectively attaches to the carbonyl groups in the PMMA and is infused in the PMMA. A second precursor, for example water vapor, is introduced which completes the reaction, converting the TMA into alumina in the PMMA. The ALD cycle can be repeated a number of times to increase the amount of infused alumina. As a result there is an upper pattern of PMMA with infused alumina directly above a lower pattern of PS with infused alumina. In FIG. 5C the PS and PMMA is removed with RIE, condensing the infused alumina in the upper PMMA on top of the previously infused alumina in the lower PS. In conventional SIS it is common that the alumina features (or other inorganic features) remaining after RIE are not continuous, resulting in broken features or broken lines. The structure of FIG. 5C has an important advantage over conventional SIS in that the second or upper alumina is deposited on top of the previously infused lower alumina. Thus even if the upper film of alumina is broken in certain sections, the lower alumina adds additional material to prevent a broken feature. In FIG. 5D, a second RIE can be used to etch into the substrate, using the alumina film as an etch mask. In the example with a Si substrate and alumina film as the inorganic material, a fluorine etch can be used to etch features into the Si substrate. In FIG. 5E, the remaining alumina and underlying sublayer material can be removed by RIE or a wet etch. Alternatively, the substrate could have suitable transfer layers, like a hard mask, between the substrate and the alumina film, to aid in transferring the chemical contrast pattern into the substrate. The resulting substrate with the etched pattern can be used as an imprint template.

In the example of FIGS. 5A-5E, the second BCP has the same natural pitch ($L_0$) as the first BCP. However, density multiplication of the pattern can be achieved by use of a second BCP that has a natural pitch that is an integer fraction, for example ½, the natural pitch of the first BCP. In such an embodiment to double the density, the PS in the lower layer would have a width one-half that shown in FIG. 5A. This would be achieved by continuing the $O_2$ RIE shown in FIG. 3B to remove additional PS material until the width of the PS features is reduced by one-half. With this pattern of reduced-width PS and SMP as the lower layer in FIG. 5A, the second BCP components would be directed to self-assemble with one PMMA feature on each reduced-width PS feature. This would cause alternating PS/PMMA/PS features to self-assemble on each lower SMP feature. The resulting chemical contrast pattern would look like that of FIG. 5C, but with double the density of AlOx features.

The ALD precursors are selected to infiltrate the inorganic material into one of the BCP components and to be non-reactive with the other BCP component. In the examples above the inorganic material is alumina and the precursors are TMA, which is reactive with the carbonyl groups in PMMA and non-reactive with PS, and water vapor. However, other inorganic materials with suitable precursors may be formed by ALD. For example, if the inorganic material is to be a titanium oxide (TiOx), the precursors may be tetrakis(dimethylamido)titanium (TDMAT) and water vapor. Alternatively, other titanium containing precursors could be used in conjunction with water, such as titanium tetrachloride ($TiCl_4$) and titanium butoxide ($Ti(OBu)_4$). If the inorganic material is to be ZnO then the precursors may be diethyl zinc and water. If the inorganic material is to be $SiO_2$ then the precursors may be tris(tert-pentoxy)silanol and water. If the inorganic material is to be tungsten (W), then the precursors may be tungsten hexafluoride and disilane. In some of these examples, if the first precursor for the desired inorganic material does not readily react with the BCP component, a first $TMA/H_2O$ cycle may be used to grow a first film of alumina and then the alumina film is used to grow the film of the desired inorganic material in subsequent cycles.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A method using a block copolymer (BCP) for making a chemical contrast pattern on a substrate comprising:
   providing a substrate;
   depositing on the substrate a sublayer for the BCP;
   patterning the sublayer;
   forming on the patterned sublayer a BCP, the BCP material being directed by the patterned sublayer to self-assemble into first and second components of the BCP;
   removing the second component and underlying sublayer to expose regions of the underlying substrate, leaving the first component on the substrate;
   depositing on the first component and the exposed substrate regions a surface modification polymer having functional end groups;
   removing portions of the surface modification polymer not bound to the substrate;
   placing the substrate with the bound surface modification polymer and first component in an atomic layer deposition (ALD) chamber;
   introducing into the ALD chamber a first precursor for an inorganic material, said first precursor being non-reactive with the surface modification polymer and reactive with the first component; and
   introducing into the ALD chamber a second precursor for said inorganic material, said second precursor being non-reactive with the surface modification polymer and reactive with said first precursor to form said inorganic material in the first component, thereby forming on the substrate a chemical contrast pattern of surface modification polymer and inorganic material.

2. The method of claim 1 wherein the BCP is a copolymer of polystyrene (PS) as said first component and poly(methyl methacrylate) (PMMA) as said second component.

3. The method of claim 2 wherein the PS and PMMA self-assemble as lamellae perpendicular to the substrate.

4. The method of claim 2 wherein removing the second component comprises removing the PMMA by reactive ion etching (RIE) in an oxygen plasma, the oxygen plasma oxidizing the PS second component.

5. The method of claim 1 wherein said inorganic material is selected from an aluminum oxide, a titanium oxide, $SiO_2$, ZnO, and W.

6. The method of claim 1 wherein said first precursor is trimethylaluminum (TMA), said second precursor is water vapor, and said inorganic material is an aluminum oxide.

7. The method of claim 1 wherein the substrate comprises a silicon oxide and wherein the functional end group of the surface modification polymer is an OH group for binding to the silicon oxide.

8. The method of claim 1 further comprising, after said inorganic material is formed in said first component, continuing the introduction of said first and second precursors while heating the substrate to form a film of said inorganic material on said first component.

9. The method of claim 1 further comprising:
   after said inorganic material is formed in the first component, removing the surface modification polymer bound to the substrate;
   etching the substrate, using said inorganic material as an etch mask; and
   thereafter removing said inorganic material and first component, leaving the etched substrate.

10. The method of claim 1 further comprising:
    forming on said chemical contrast pattern of surface modification polymer and inorganic material additional BCP, the additional BCP being directed by the chemical contrast pattern to self assemble with the second component of the additional BCP on the inorganic material and the first component of the additional BCP on the surface modification polymer.

11. The method of claim 10 further comprising:
after the additional BCP components have self assembled, removing the BCP components and surface modification polymer, leaving a pattern of inorganic material on the substrate; and
etching the substrate using the inorganic material as an etch mask.

12. The method of claim 10 wherein the additional BCP has the same components as the BCP formed on said patterned sublayer.

13. The method of claim 10 wherein the additional BCP has a natural pitch that is an integer fraction of the natural pitch of the BCP formed on said patterned sublayer.

14. A method using a block copolymer (BCP) for making a chemical contrast pattern on a substrate comprising:
providing a substrate;
forming on the substrate a block copolymer of polystyrene (PS) and poly(methyl methacrylate) (PMMA) self-assembled into a pattern of PS and PMMA;
removing the PMMA to expose regions of the underlying substrate, leaving the PS on the substrate;
oxidizing the PS;
depositing on the PS and the exposed substrate regions a surface modification polymer having functional end groups;
removing portions of the surface modification polymer not bound to the substrate;
placing the substrate with the bound surface modification polymer and oxidized PS in an atomic layer deposition (ALD) chamber;
introducing into the ALD chamber a first precursor for an inorganic material, said first precursor being non-reactive with the surface modification polymer and reactive with the oxidized PS; and
introducing into the ALD chamber a second precursor for said inorganic material, said second precursor being non-reactive with the surface modification polymer and reactive with said first precursor to form said inorganic material in the oxidized PS, thereby forming on the substrate a chemical contrast pattern of surface modification polymer and inorganic material.

15. The method of claim 14 wherein the PS and PMMA are self-assembled as lamellae perpendicular to the substrate.

16. The method of claim 14 wherein the steps of removing the PMMA to expose regions of the underlying substrate and oxidizing the PS comprise reactive ion etching (RIE) in an oxygen plasma to simultaneously remove the PMMA and oxidize the PS.

17. The method of claim 14 wherein said inorganic material is selected from an aluminum oxide, a titanium oxide, $SiO_2$, ZnO, and W.

18. The method of claim 14 wherein said first precursor is trimethylaluminum (TMA), said second precursor is water vapor, and said inorganic material is an aluminum oxide.

19. The method of claim 14 wherein the substrate comprises a silicon oxide and wherein the functional end group of the surface modification polymer is an OH group for binding to the silicon oxide.

20. The method of claim 14 further comprising, after said inorganic material is formed in the PS, continuing the introduction of said first and second precursors while heating the substrate to form a film of said inorganic material on the PS.

21. The method of claim 14 further comprising:
after said inorganic material is formed in the PS, removing the surface modification polymer bound to the substrate;
etching the substrate, using said inorganic material as an etch mask; and
thereafter removing said inorganic material and PS, leaving the etched substrate.

22. The method of claim 14 wherein the self-assembled pattern of PS and PMMA on the substrate is a first layer and further comprising:
forming on said chemical contrast pattern of surface modification polymer and inorganic material a second layer of additional PMMA and PS, the additional PMMA and PS being directed by the chemical contrast pattern to self assemble with the additional PMMA on the inorganic material and the additional PS on the surface modification polymer;
removing the PS in the first layer and the surface modification polymer and the PMMA and PS in the second layer, leaving a pattern of inorganic material on the substrate; and
etching the substrate using the inorganic material as an etch mask.

23. The method of claim 22 wherein the second layer of additional PMMA and PS has a natural pitch that is an integer fraction of the natural pitch of said first layer of PS and PMMA.

* * * * *